(12) United States Patent
Chen et al.

(10) Patent No.: US 7,529,103 B2
(45) Date of Patent: May 5, 2009

(54) MULTI-LAYERED PRINTED CIRCUIT BOARD EMBEDDED WITH FILTER

(75) Inventors: Chang-Sheng Chen, Taipei (TW); Uei-Ming Jow, Taichung (TW); Ying-Jiunn Lai, Pingtung County (TW); Chin-Sun Shyu, Pingtung County (TW)

(73) Assignee: Industrial Technology Research Institute, Hsinchu (TW)

( * ) Notice: Subject to any disclaimer, the term of this patent is extended or adjusted under 35 U.S.C. 154(b) by 344 days.

(21) Appl. No.: 11/438,363

(22) Filed: May 23, 2006

(65) Prior Publication Data

US 2007/0133182 A1    Jun. 14, 2007

(30) Foreign Application Priority Data

Dec. 8, 2005    (TW)    .............................. 94143410 A

(51) Int. Cl.
*H05K 1/14*    (2006.01)
(52) U.S. Cl. ........................................ 361/794; 361/311
(58) Field of Classification Search ......... 361/311–313, 361/794; 174/255, 260, 258, 256
See application file for complete search history.

(56) References Cited

U.S. PATENT DOCUMENTS

| | | | |
|---|---|---|---|
| 6,448,873 B1 | 9/2002 | Mostov | |
| 6,577,208 B2 | 6/2003 | Kushitani et al. | |
| 6,633,209 B2 * | 10/2003 | Kushitani et al. | 333/175 |
| 7,305,223 B2 * | 12/2007 | Liu et al. | 455/333 |
| 2004/0184247 A1 * | 9/2004 | Adriaenssens et al. | 361/766 |
| 2006/0170518 A1 * | 8/2006 | Chang | 333/185 |
| 2007/0115702 A1 * | 5/2007 | Lee et al. | 363/47 |

\* cited by examiner

*Primary Examiner*—Dean A. Reichard
*Assistant Examiner*—Yuriy Semenenko
(74) *Attorney, Agent, or Firm*—Birch, Stewart, Kolasch & Birch, LLP

(57) ABSTRACT

A multi-layered printed circuit board embedded with a filter, the multi-layered printed circuit board using a composite multi-layered printed circuit board formed of at least a high dielectric material stacked with at least a low dielectric material. A plurality of serial or parallel capacitors are disposed in the composite multi-layered printed circuit board so as to form a filter. At least one capacitor is an interdigital capacitor disposed on a low dielectric material. Metal electrodes of the interdigital capacitor are located on the same plane such that the area of the metal electrodes or the spacing between the metal electrodes can be adjusted in advance to precisely control the electrical properties such as the center frequency and the transmission loss of the filter. Problems resulting from alignment errors caused in manufacturing the composite multi-layered printed circuit board can also be prevented.

10 Claims, 6 Drawing Sheets

MULTI-LAYERED PRINTED CIRCUIT BOARD EMBEDDED WITH FILTER

BACKGROUND OF THE INVENTION

1. Field of the Invention

The present invention generally relates to a multi-layered printed circuit board embedded with a filter and, more particularly, to a composite multi-layered printed circuit board formed of at least a high dielectric material stacked with at least a low dielectric material. At least one interdigital capacitor is disposed on a low dielectric material and metal electrodes of the interdigital capacitor are located on the same plane such that the area of the metal electrodes or the spacing between the metal electrodes can be adjusted in advance to precisely control the electrical properties such as the center frequency and the transmission loss of the filter.

2. Description of the Prior Art

In recent years, it has been feasible to manufacture radio frequency (RF) microwave devices such as RF filters using printed circuit boards (PCBs). However, with the fast development in modern technologies, the quality as well as the performance of the filters using PCBs is critically emphasized so as to precisely control the electrical characteristics such as center frequency, band-width, return loss, insertion loss and out-band rejection. Moreover, in order to consider the deviation caused during PCB manufacturing prior to circuit design for systematic evaluation, it is required a PCB structure, in which the electrical characteristics can be easily controlled.

In U.S. Pat. No. 6,448,873, entitled "LC Filter with Suspended Printed Inductor and Compensating Interdigital Capacitor", a spiral inductor coupled in parallel with an interdigital capacitor is used to form a LC resonance circuit and a filter circuit can be thus formed using a plurality of the LC resonance circuits coupled serially with a capacitor. The capacitor can be a surface mounted device (SNM). Even though U.S. Pat. No. 6,448,873 discloses a filter embedded in a PCB using interdigital capacitors, the interdigital capacitors are for LC resonance, not for the serial connection.

Moreover, in U.S. Pat. No. 6,577,208, entitled "Radio Frequency Filter", wherein a ceramic substrate is used and thus a modular filter is an SMD, the utilized interdigital capacitors are coupled serially with a wire wounded inductor. However, the application of the interdigital capacitors in the filter is not stated.

Therefore, there exists a need in providing a multi-layered printed circuit board embedded with a filter, the multi-layered printed circuit board using a composite multi-layered printed circuit board formed of at least a high dielectric material stacked with at least a low dielectric material. At least one capacitor is an interdigital capacitor disposed on a low dielectric material. Metal electrodes of the interdigital capacitor are located on the same plane such that the area of the metal electrodes or the spacing between the metal electrodes can be adjusted in advance to precisely control the electrical properties such as the center frequency and the transmission loss of the filter. Problems resulting from alignment errors caused in manufacturing the composite multi-layered printed circuit board can also be prevented.

SUMMARY OF THE INVENTION

It is a primary object of the present invention to provide a multi-layered printed circuit board embedded with a filter, the multi-layered printed circuit board using a composite multi-layered printed circuit board formed of at least a high dielectric material stacked with at least a low dielectric material, wherein metal electrodes of interdigital capacitor are located on the same plane such that the area of the metal electrodes or the spacing between the metal electrodes can be adjusted in advance to precisely control the electrical properties such as the center frequency and the transmission loss of the filter. Problems resulting from alignment errors caused in manufacturing the composite multi-layered printed circuit board can also be prevented.

It is a secondary object of the present invention to provide a multi-layered printed circuit board embedded with a filter, the multi-layered printed circuit board using a composite multi-layered printed circuit board formed of at least a high dielectric material stacked with at least a low dielectric material, wherein parallel-plate capacitors are formed using the high dielectric material to enhance the band-width of the filter.

In order to achieve the foregoing object, the present invention provides a multi-layered printed circuit board embedded with a filter, the multi-layered printed circuit board using a composite multi-layered printed circuit board formed of at least a high dielectric material stacked with at least a low dielectric material, the composite multi-layered printed circuit board comprising: a substrate, a first metal layer being disposed on the substrate; a high dielectric material layer stacked on the first metal layer, a second metal layer being disposed on the high dielectric material layer; and a first low dielectric material layer stacked on the second metal layer, a third metal layer being disposed on the first low dielectric material layer; wherein a plurality of serial or parallel parallel-plate capacitors are disposed in the composite multi-layered printed circuit board so as to form a filter, characterized in that at least one serial capacitor is an interdigital capacitor disposed on the third metal layer on the first low dielectric material, the interdigital capacitor having a plurality of digits on both electrodes using the third metal layer.

BRIEF DESCRIPTION OF THE DRAWINGS

The objects, spirits and advantages of the preferred embodiments of the present invention will be readily understood by the accompanying drawings and detailed descriptions, wherein.

DETAILED DESCRIPTION OF THE PREFERRED EMBODIMENT

The present invention providing a multi-layered printed circuit board embedded with a filter can be exemplified by the preferred embodiments as described hereinafter.

Figure 1:
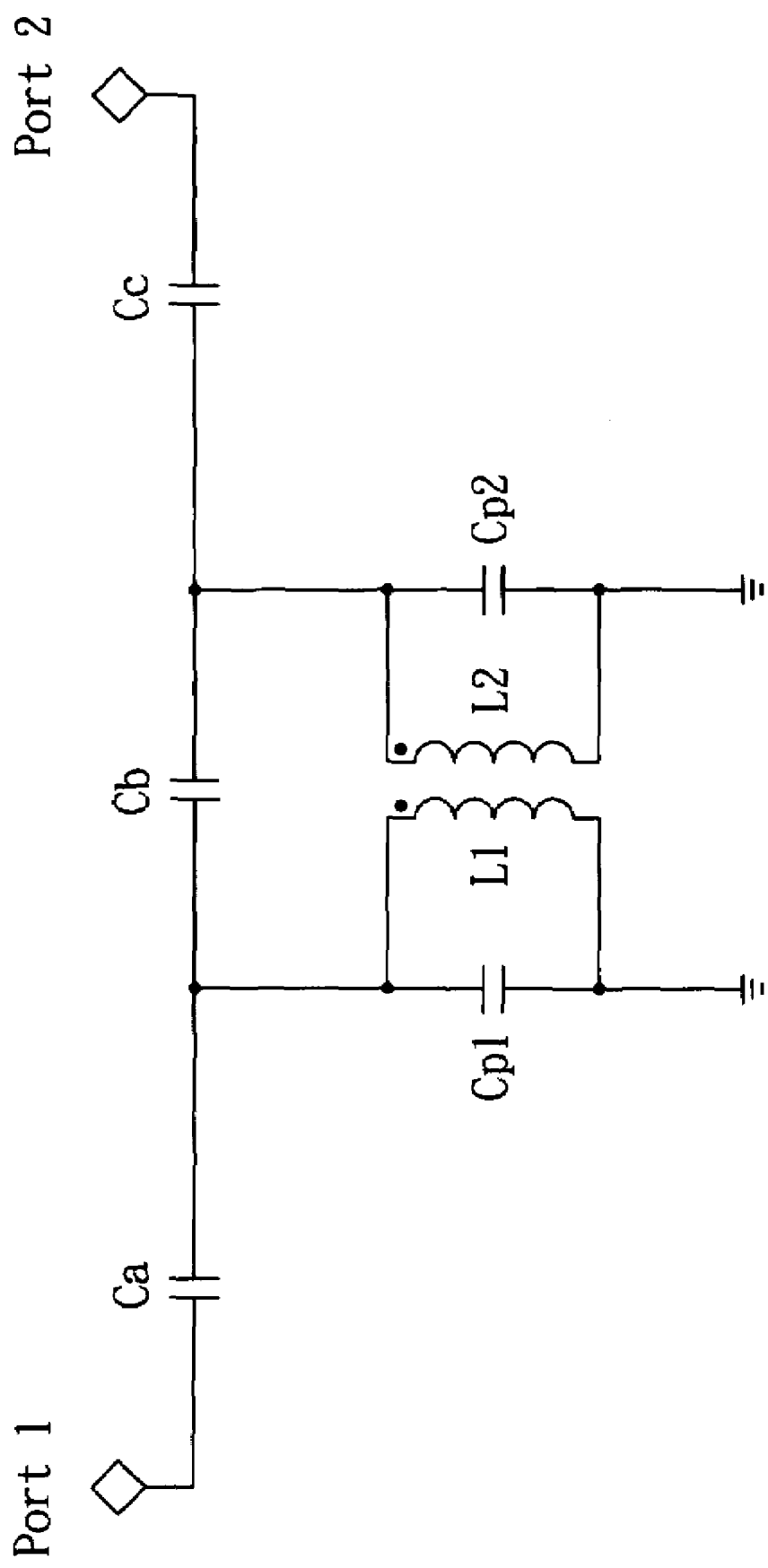
FIG. 1 is an equivalent circuit diagram of a filter according to the present invention.

Please refer to FIG. 1, which is an equivalent circuit diagram of a filter according to the present invention. On the transmission path from Port 1 to Port 2, there are provided three serial capacitors Ca, Cb and Cc. Each of the terminals of the serial capacitor Cb is coupled to a LC parallel resonance circuit. Namely, the parallel resonance circuit including capacitor Cp1 and inductor L1 and the parallel resonance circuit including capacitor Cp2 and inductor L2 are disposed on respective terminal of the capacitor Cb. More particularly, mutual inductance appears between inductor L1 and inductor L2.

Figure 2:
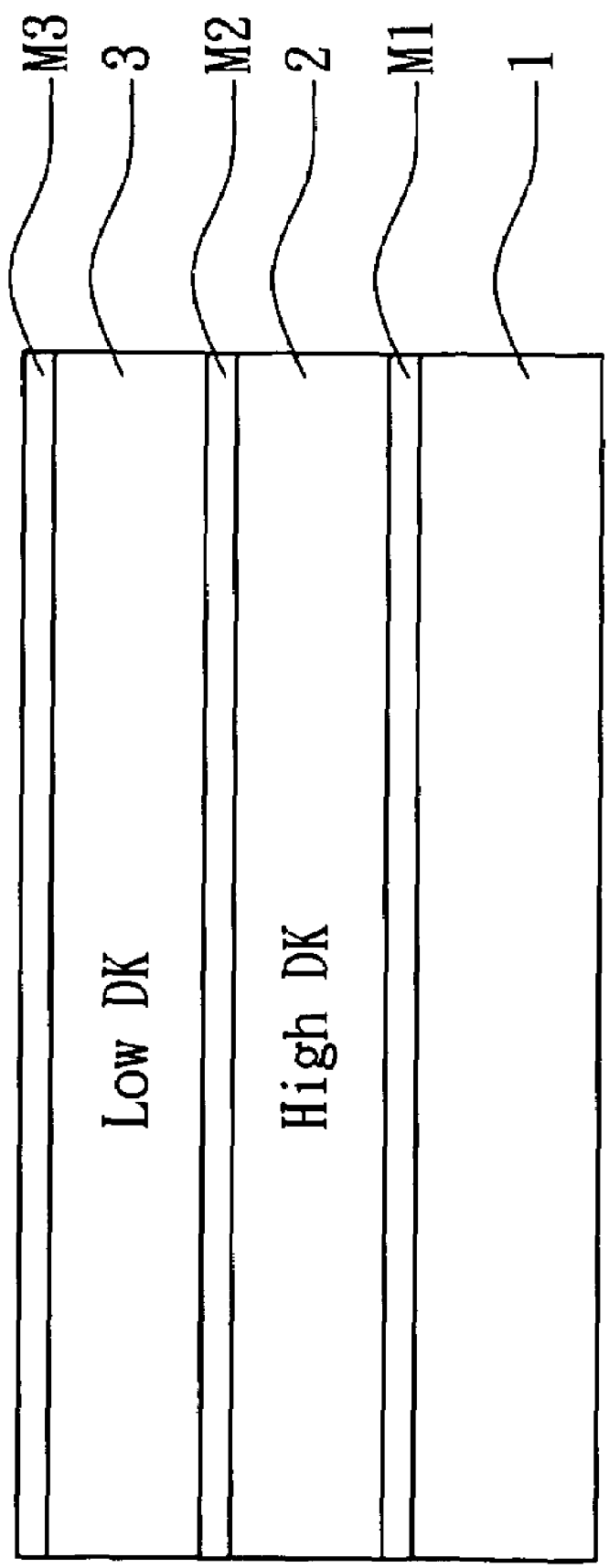
FIG. 2 is a cross-sectional view of a multi-layered printed circuit board according to the present invention.

FIG. 2 is a cross-sectional view of a multi-layered printed circuit board according to the present invention. The substrate 1 is stacked with a high dielectric material 2 and a low dielectric material 3. Moreover, a first metal layer M1, a second metal layer M2 and a third metal layer M3 are formed on the substrate 1, the high dielectric material 2 and the low dielectric material 3, respectively. In the present embodiment, the low dielectric material 3 is Mitsui MR500 with a dielectric constant of 3.4 and the high dielectric material 2 is High Dk40 with a dielectric constant of 40.

Figure 3:
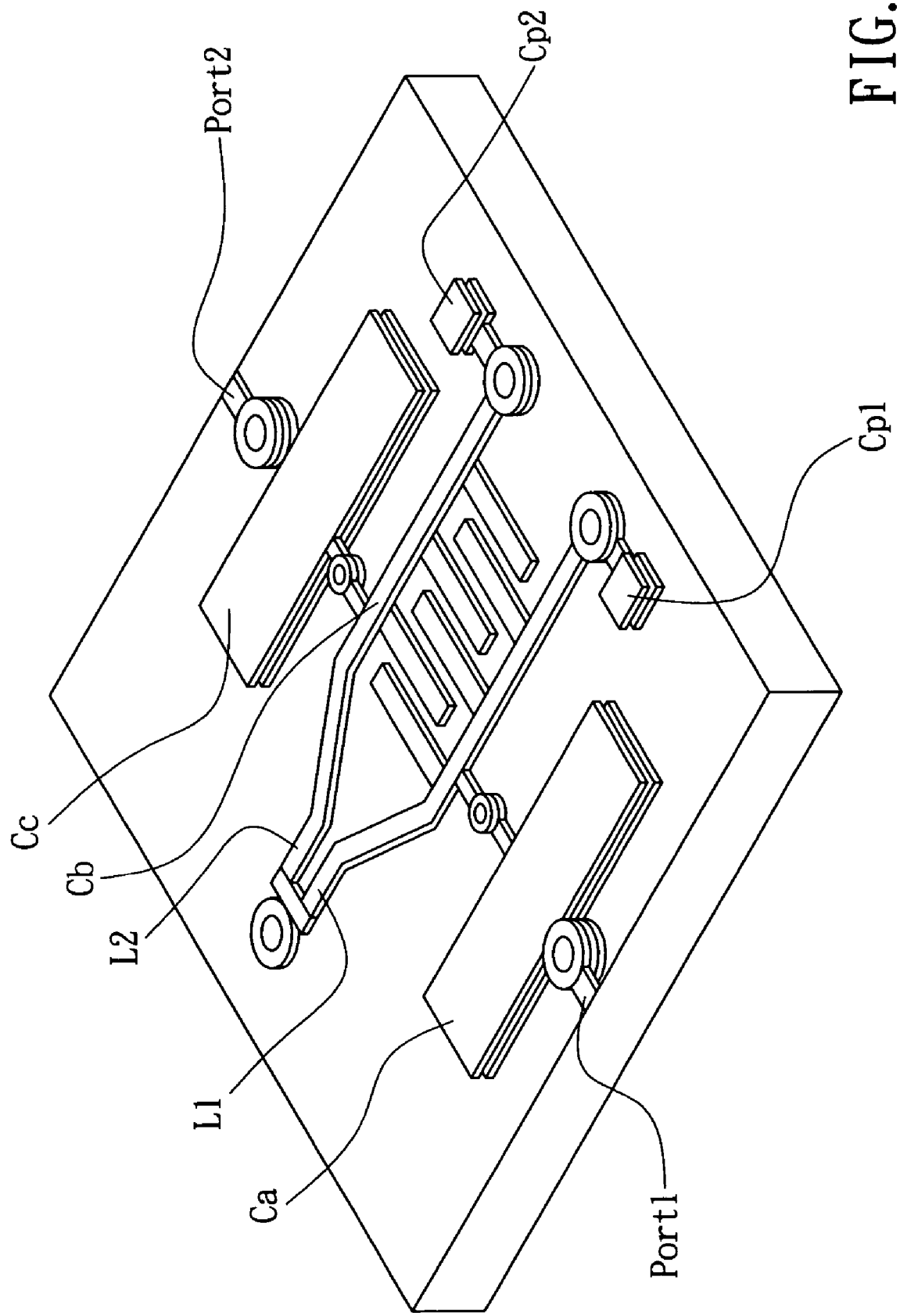
FIG. 3 is a schematic layout diagram of a multi-layered printed circuit board embedded with a filter according to the first embodiment of the present invention.

FIG. 3 is a schematic layout diagram of a multi-layered printed circuit board embedded with a filter according to the first embodiment of the present invention. On the transmission path from Port 1 to Port 2, the serial capacitors Ca and Cc are parallel-plate capacitors with relatively larger capacitance so as to increase the band-width of the embedded filter. Therefore, the serial capacitors Ca and Cc use the high dielectric material 2 disposed between the second metal plate M2 and the first metal plate M1 as shown in FIG. 2. More particularly, mutual inductance appears between inductor L1 and inductor L2. The serial capacitor Cb is an interdigital capacitor with three digits on each of the electrodes. Because the capacitance of the interdigital capacitor depends on the lengths, widths and spacings of the digits, the interdigital capacitor Cb for determining the center frequency of the filter can be precisely controlled when it is being designed. The capacitance of the serial capacitor Cb is relatively smaller, thus it is disposed on the low dielectric material 3 as shown in FIG. 2 and uses the third metal layer M3 as the digits. Alternatively, the serial capacitor Cb can also be disposed on the high dielectric material for larger capacitance. Since the digits of the interdigital capacitor Cb are exposed to the air with a low dielectric constant, the transmission loss of the filter can be lowered. On the other hand, the interdigital capacitor Cb only uses the low dielectric material 3 and the third metal layer M3 as shown in FIG. 2, the problem resulting from alignment errors caused in manufacturing the composite multi-layered printed circuit board can be prevented.

Furthermore, in FIG. 3, each of the terminals of the serial capacitor Cb is coupled to a LC parallel resonance circuit. Namely, the parallel resonance circuit including capacitor Cp1 and inductor L1 and the parallel resonance circuit including capacitor Cp2 and inductor L2 are disposed on respective terminal of the capacitor Cb. In FIG. 3, the capacitor Cp1 and the Capacitor Cp2 are parallel-plate capacitors. In other words, the capacitors Cp1 and Cp2 use the high dielectric material 2 between the second metal plate M2 and the first metal layer M1 as shown in FIG. 2. In this case, the second metal plate M2 is grounded. The inductors L1 and L2 use a micro-strip transmission line of the third metal layer M3 and mutual inductance appears between inductor L1 and inductor L2. In the present invention, the inductors L1 and L2 can be implemented using trance inductors, sinusoidal inductors, spiral inductors, and meander line inductors.

Figure 4:
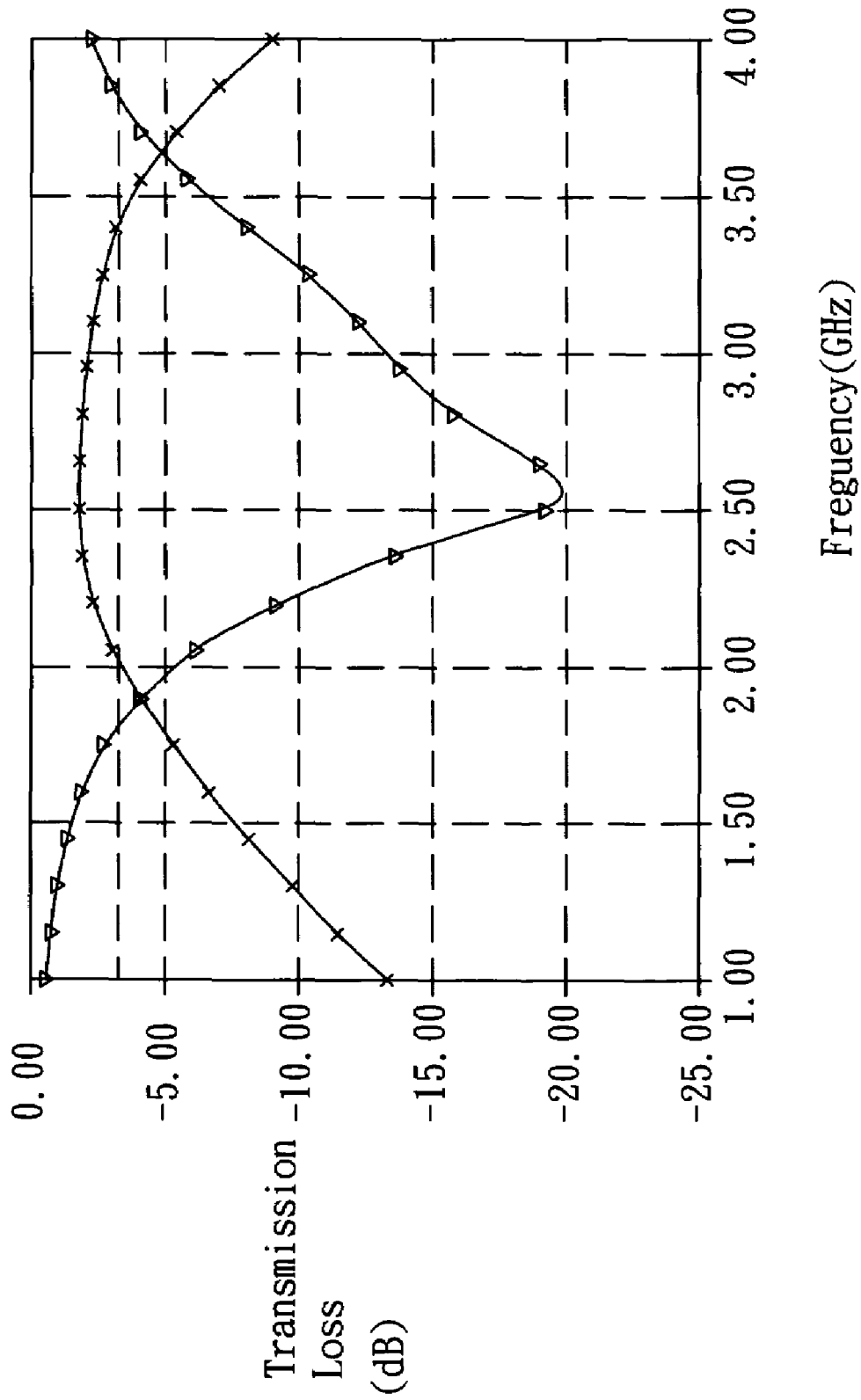
FIG. 4 shows the electrical characteristics of a multi-layered printed circuit board embedded with a filter according to the first embodiment of the present invention.

FIG. 4 shows the electrical characteristics of a multi-layered printed circuit board embedded with a filter according to the first embodiment of the present invention. In this figure, the composite multi-layered printed circuit board as shown in FIG. 2 and the layout in FIG. 3 result in a band-width (−3 dB) of 1.2 GHz (i.e., from 2.0 GHz to 3.2 GHz) and a transmission loss of −1.73 dB, which are much better than the electrical characteristics of conventional SMD elements using LTCC.

Figure 5:
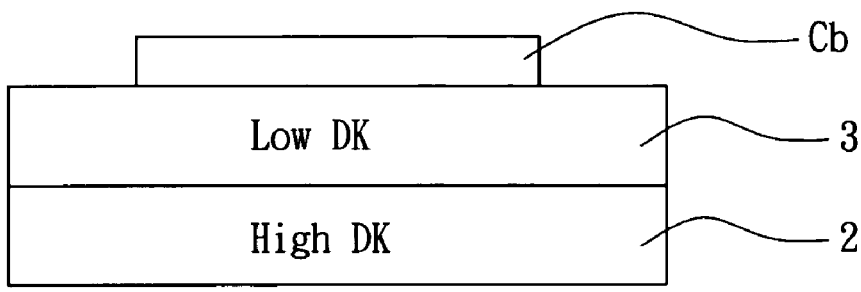
FIG. 5 is a cross-sectional view of an interdigital capacitor according to the first embodiment of the present invention.

FIG. 5 is a cross-sectional view of an interdigital capacitor Cb according to the first embodiment of the present invention. In the first embodiment, a high dielectric material 2 and a low dielectric material 3 are stacked in order on the substrate, and the interdigital capacitor Cb is formed using the metal layer on the low dielectric material 3.

Figure 6:
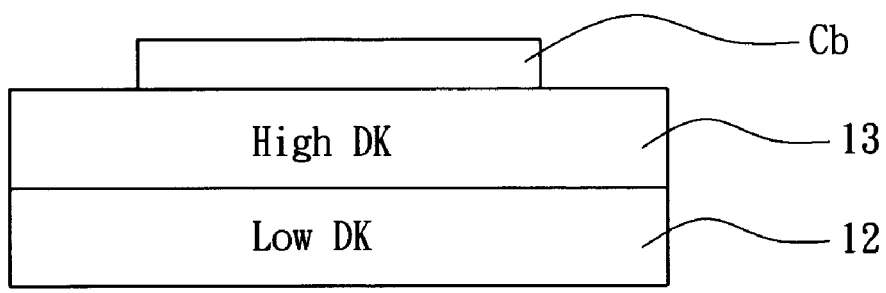
FIG. 6 is a cross-sectional view of an interdigital capacitor according to the second embodiment of the present invention.

In addition to the first embodiment, the interdigital capacitor Cb can be implemented as the second embodiment as shown in FIG. 6, wherein a low dielectric material 12 and a high dielectric material 13 are stacked in order on the substrate, and the interdigital capacitor Cb is formed using the metal layer on the high dielectric material 13.

Figure 7:
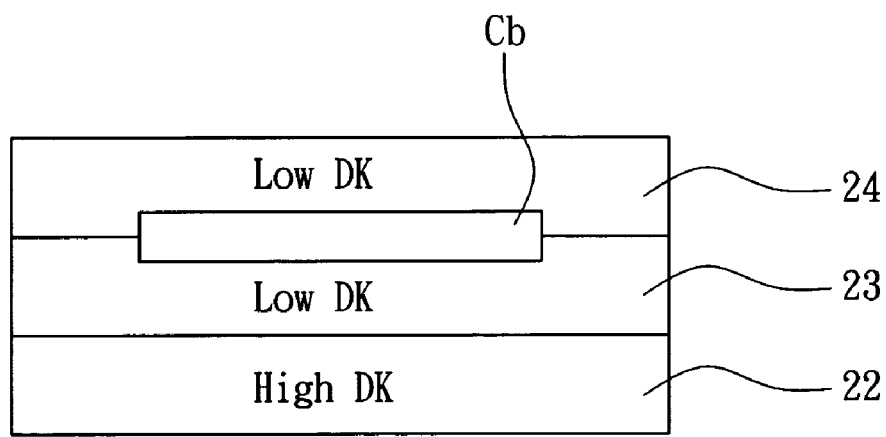
FIG. 7 is a cross-sectional view of an interdigital capacitor according to the third embodiment of the present invention.

Moreover, the interdigital capacitor Cb can be implemented as the third embodiment as shown in FIG. 7, wherein a high dielectric material 22 and a low dielectric material 23 are stacked in order on the substrate, and the interdigital capacitor Cb is formed using the metal layer on the high dielectric material 23 on which an additional low dielectric material 24 is formed.

Figure 8:
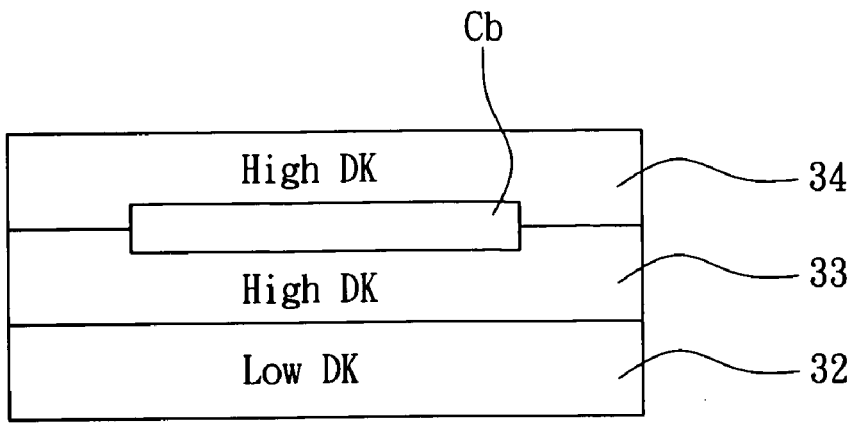
FIG. 8 is a cross-sectional view of an interdigital capacitor according to the fourth embodiment of the present invention.

Moreover, the interdigital capacitor Cb can be implemented as the fourth embodiment as shown in FIG. 8, wherein a low dielectric material 32 and a high dielectric material 33 are stacked in order on the substrate, and the interdigital capacitor Cb is formed using the metal layer on the high dielectric material 33 on which an additional high dielectric material 34 is formed.

Figure 9:
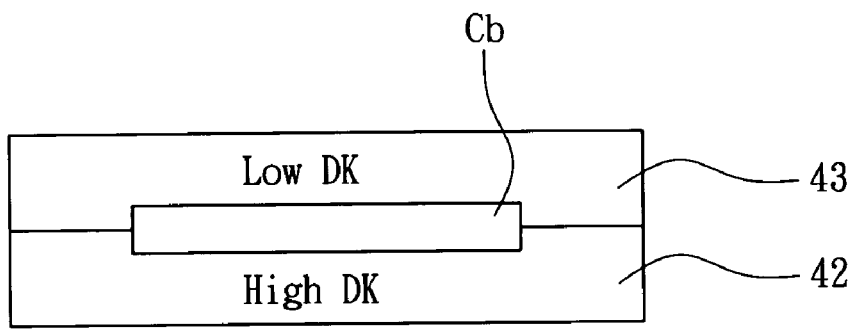
FIG. 9 is a cross-sectional view of an interdigital capacitor according to the fifth embodiment of the present invention.

Moreover, the interdigital capacitor Cb can be implemented as the fifth embodiment as shown in FIG. 9, wherein a high dielectric material 42 and a low dielectric material 43 are stacked in order on the substrate, and the interdigital capacitor Cb is formed using the metal layer on the high dielectric material 42.

Figure 10:
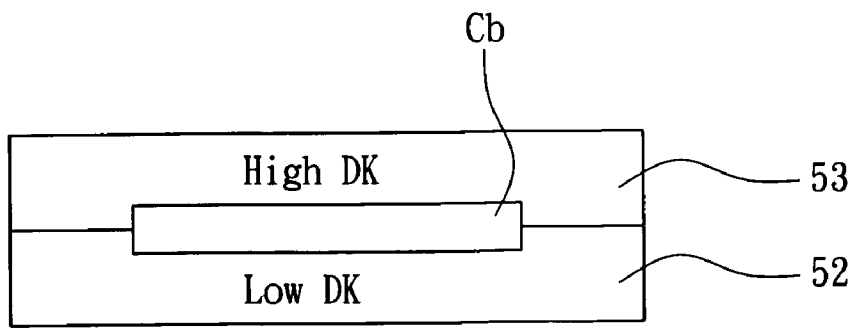
FIG. 10 is a cross-sectional view of an interdigital capacitor according to the sixth embodiment of the present invention.

Moreover, the interdigital capacitor Cb can be implemented as the sixth embodiment as shown in FIG. 10, wherein a low dielectric material 52 and a high dielectric material 53 are stacked in order on the substrate, and the interdigital capacitor Cb is formed using the metal layer on the low dielectric material 52.

According to the above discussion, it is apparent that the present invention discloses a multi-layered printed circuit board embedded with a filter, the multi-layered printed circuit board using a composite multi-layered printed circuit board formed of at least a high dielectric material stacked with at least a low dielectric material. At least one capacitor is an interdigital capacitor disposed on a low dielectric material. Metal electrodes of the interdigital capacitor are located on the same plane such that the area of the metal electrodes or the spacing between the metal electrodes can be adjusted in advance to precisely control the electrical properties such as the center frequency and the transmission loss of the filter. Problems resulting from alignment errors caused in manufacturing the composite multi-layered printed circuit board can also be prevented.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A multi-layered printed circuit board embedded with a filter, the multi-layered printed circuit board using a composite multi-layered printed circuit board formed of at least a high dielectric material stacked with at least a low dielectric material, the composite multi-layered printed circuit board comprising:
   a substrate, a first metal layer being disposed on the substrate;
   a high dielectric material layer stacked on the first metal layer, a second metal layer being disposed on the high dielectric material layer; and;
   a first low dielectric material layer stacked on the second metal layer, a third metal layer being disposed on the first low dielectric material layer;
   wherein a plurality of serial or parallel capacitors are disposed in the composite multi-layered printed circuit board so as to form a filter, characterized in that at least one serial capacitor is an interdigital capacitor disposed on the third metal layer on the first low dielectric material, the interdigital capacitor having a plurality of digits on both electrodes using the third metal layer,
   wherein the interdigital capacitor is connected in serial to parallel-plate capacitors between the metal layers so as to form the embedded filter.

2. The multi-layered printed circuit board embedded with a filter as recited in claim 1, wherein an second low dielectric material layer is stacked on third metal layer on the first low dielectric material, a fourth metal layer being disposed on the second low dielectric material layer.

3. The multi-layered printed circuit board embedded with a filter as recited in claim 1, wherein the interdigital capacitor is disposed on the second metal layer on the high dielectric material, and the interdigital capacitor uses the second metal layer.

4. The multi-layered printed circuit board embedded with a filter as recited in claims 1, wherein the interdigital capacitor is connected in serial or in parallel to at least an inductor so as to form the embedded filter, the inductor being a coupled mutual inductor.

5. The multi-layered printed circuit board embedded with a filter as recited in claim 4, wherein the inductor is a trace inductor, a sinusoidal inductor, a spiral inductor or a meander line inductor.

6. A multi-layered printed circuit board embedded with a filter, the multi-layered printed circuit board using a composite multi-layered printed circuit board formed of at least a high dielectric material stacked with at least a low dielectric material, the composite multi-layered printed circuit board comprising:
   a substrate, a first metal layer being disposed on the substrate;
   a low dielectric material layer stacked on the first metal layer, a second metal layer being disposed on the low dielectric material layer; and
   a first high dielectric material layer stacked on the second metal layer, a third metal layer being disposed on the first high dielectric material layer;
   wherein a plurality of serial or parallel capacitors are disposed in the composite multi-layered printed circuit board so as to form a filter, characterized in that at least one serial capacitor is an interdigital capacitor disposed on the third metal layer on the first high dielectric material, the interdigital capacitor having a plurality of digits on both electrodes using the third metal layer,
   wherein the interdigital capacitor is connected in serial to parallel-plate capacitors between the metal layers so as to form the embedded filter.

7. The multi-layered printed circuit board embedded with a filter as recited in claim 6, wherein an second high dielectric material layer is stacked on third metal layer on the first high dielectric material, a fourth metal layer being disposed on the second high dielectric material layer.

8. The multi-layered printed circuit board embedded with a filter as recited in claim 6, wherein the interdigital capacitor is disposed on the second metal layer on the low dielectric material, and the interdigital capacitor uses the second metal layer.

9. The multi-layered printed circuit board embedded with a filter as recited in claims 6, wherein the interdigital capacitor is connected in serial or in parallel to at least an inductor so as to form the embedded filter, the inductor being a coupled mutual inductor.

10. The multi-layered printed circuit board embedded with a filter as recited in claim 9, wherein the inductor is a trace inductor, a sinusoidal inductor, a spiral inductor or a meander line inductor.

* * * * *